(12) United States Patent
Nishi

(10) Patent No.: US 9,432,177 B2
(45) Date of Patent: Aug. 30, 2016

(54) COMMUNICATION APPARATUS AND RECEPTION METHOD

(71) Applicant: MITSUBISHI ELECTRIC CORPORATION, Chiyoda-ku (JP)

(72) Inventor: Yohei Nishi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/781,241

(22) PCT Filed: Mar. 10, 2014

(86) PCT No.: PCT/JP2014/056159
§ 371 (c)(1),
(2) Date: Sep. 29, 2015

(87) PCT Pub. No.: WO2014/167927
PCT Pub. Date: Oct. 16, 2014

(65) Prior Publication Data
US 2016/0056951 A1 Feb. 25, 2016

(30) Foreign Application Priority Data
Apr. 12, 2013 (JP) ................................. 2013-083441

(51) Int. Cl.
*H04L 1/20* (2006.01)
*H04L 7/00* (2006.01)
(Continued)

(52) U.S. Cl.
CPC ................. *H04L 7/0062* (2013.01); *H03J 7/04* (2013.01); *H04L 1/0054* (2013.01); *H04L 1/203* (2013.01); *H04L 1/206* (2013.01)

(58) Field of Classification Search
USPC .......................... 375/224, 260, 340, 343, 344
See application file for complete search history.

(56) References Cited

U.S. PATENT DOCUMENTS

| 6,704,552 B1 | 3/2004 | Matsumoto |
| 2006/0203950 A1 | 9/2006 | Chung et al. |
| 2007/0058808 A1* | 3/2007 | Rudolf .................. H04L 9/0841 380/44 |

(Continued)

FOREIGN PATENT DOCUMENTS

| JP | 2001-086031 A | 3/2001 |
| JP | 2001-102906 A | 4/2001 |

(Continued)

OTHER PUBLICATIONS

Office Action issued Jan. 5, 2016 in Japanese Patent Application No. 2015-511159 (with English language translation).

(Continued)

*Primary Examiner* — Eva Puente
(74) *Attorney, Agent, or Firm* — Oblon, McClelland, Maier & Neustadt, L.L.P.

(57) ABSTRACT

In a communication apparatus for receiving signals of frequency channels, a synchronization determiner determines whether synchronization of a demodulated signal is established. A BER calculator calculates a pseudo BER of the demodulated signal with the synchronization established. A comparator detects a frequency channel having the lowest pseudo BER, that is, the best value of the evaluation scale defined for transmission quality. A correction value calculator calculates a correction value for a symbol clock frequency in each frequency channel, based on a symbol clock frequency deviation in the frequency channel having the best value of the evaluation scale.

12 Claims, 8 Drawing Sheets

(51) Int. Cl.
*H03J 7/04* (2006.01)
*H04L 1/00* (2006.01)

(56) References Cited

U.S. PATENT DOCUMENTS

| | | | | |
|---|---|---|---|---|
| 2007/0217525 | A1* | 9/2007 | Vrcelj | H04L 27/2657 375/260 |
| 2009/0091381 | A1* | 4/2009 | Amano | H03G 3/3068 330/2 |
| 2010/0220646 | A1 | 9/2010 | Brown et al. | |
| 2012/0033753 | A1* | 2/2012 | Hamaguchi | H04L 5/0044 375/260 |
| 2014/0033259 | A1* | 1/2014 | Strong | H04H 20/63 725/71 |
| 2015/0172086 | A1* | 6/2015 | Khoshgard | H04L 27/2646 375/260 |

FOREIGN PATENT DOCUMENTS

| | | |
|---|---|---|
| JP | 2001-237754 A | 8/2001 |
| JP | 2006-140631 A | 6/2006 |
| JP | 3809561 B2 | 6/2006 |
| JP | 2008-532434 A | 8/2008 |
| JP | 2009-130912 A | 6/2009 |
| JP | 4569362 B2 | 8/2010 |
| JP | 4867652 B2 | 2/2012 |
| JP | 2012-519985 A | 8/2012 |
| JP | 2012-231226 A | 11/2012 |
| WO | 2010/097349 A2 | 9/2010 |

OTHER PUBLICATIONS

Japanese Office Action issued Mar. 29, 2016 in Patent Application No. 2015-511159 (with English language translation).
International Search Report issued on May 27, 2014 for PCT/JP2014/056159 filed on Mar. 10, 2014.

* cited by examiner

COMMUNICATION APPARATUS AND RECEPTION METHOD

TECHNICAL FIELD

The present disclosure relates to a communication apparatus for receiving signals of frequency channels and a reception method thereof.

BACKGROUND ART

In a communication apparatus for receiving and transmitting signals of frequency channels, a symbol clock frequency deviation, a carrier frequency deviation, or the like is corrected in signal reception individually for each frequency channel.

Patent Literature 1 discloses a technique relating to the compensation at a receiving side. A compensation apparatus disclosed in Patent Literature 1 determines at least one of a phase offset for a frequency channel among frequency channels and a gain offset for the frequency channel to compensate for any gain variation within a carrier. Then, the determined at least one of the phase offset and the gain offset is applied before the carrier is regenerated from the frequency channels to compensate for any undesired gain and group delay digitally.

CITATION LIST

Patent Literature

Patent Literature 1: National Patent Publication No. 2012-519985

SUMMARY OF INVENTION

Technical Problem

In a communication apparatus for receiving signals of frequency channels, when the received signal in each frequency channel is buried in noise or the like, the communication apparatus estimates a correction value for a symbol clock frequency deviation or a carrier frequency deviation based on the quality of each received signal. Thus the required time depends on the received signal quality of each frequency channel. In addition, the compensation apparatus disclosed in Patent Literature 1 cannot correct the symbol clock frequency deviation or the carrier frequency deviation of each frequency channel.

The present disclosure is made to solve the problems described above, and an objective of the present disclosure is to reduce the time required for establishing reception synchronization in a communication apparatus for receiving signals of frequency channels.

Solution to Problem

To achieve the above objective, a communication apparatus of the present disclosure for receiving signals of frequency channels includes an oscillator, a demodulator, a deviation calculator, a quality calculator, and a correction value calculator. The oscillator outputs a reference signal having a frequency corresponding to each of the frequency channels. The demodulator demodulates a signal received in each of the frequency channels and generates a demodulated signal. The deviation calculator calculates a frequency deviation that is a difference in frequency between the demodulated signal and the reference signal in each of the frequency channels. The quality calculator calculates transmission quality of each of the frequency channels. The correction value calculator calculates, based on the frequency deviation in a frequency channel determined for the transmission quality calculated by the quality calculator, a correction value for the frequency of the reference signal in each of the frequency channels. The oscillator corrects, based on the correction value, the frequency of the reference signal, and outputs the reference signal having the corrected frequency.

Advantageous Effects of Invention

According to the present disclosure, the communication apparatus for receiving signals of frequency channels calculates, based on the frequency deviation and the correction value that have been calculated, a correction value to be used for another frequency channel, which can reduce the time required for establishing reception synchronization.

DESCRIPTION OF EMBODIMENTS

Embodiments of the present disclosure are described hereinafter with reference to the drawings. The same reference signs denote the same or similar portions throughout the drawings.

First Embodiment

Figure 1:
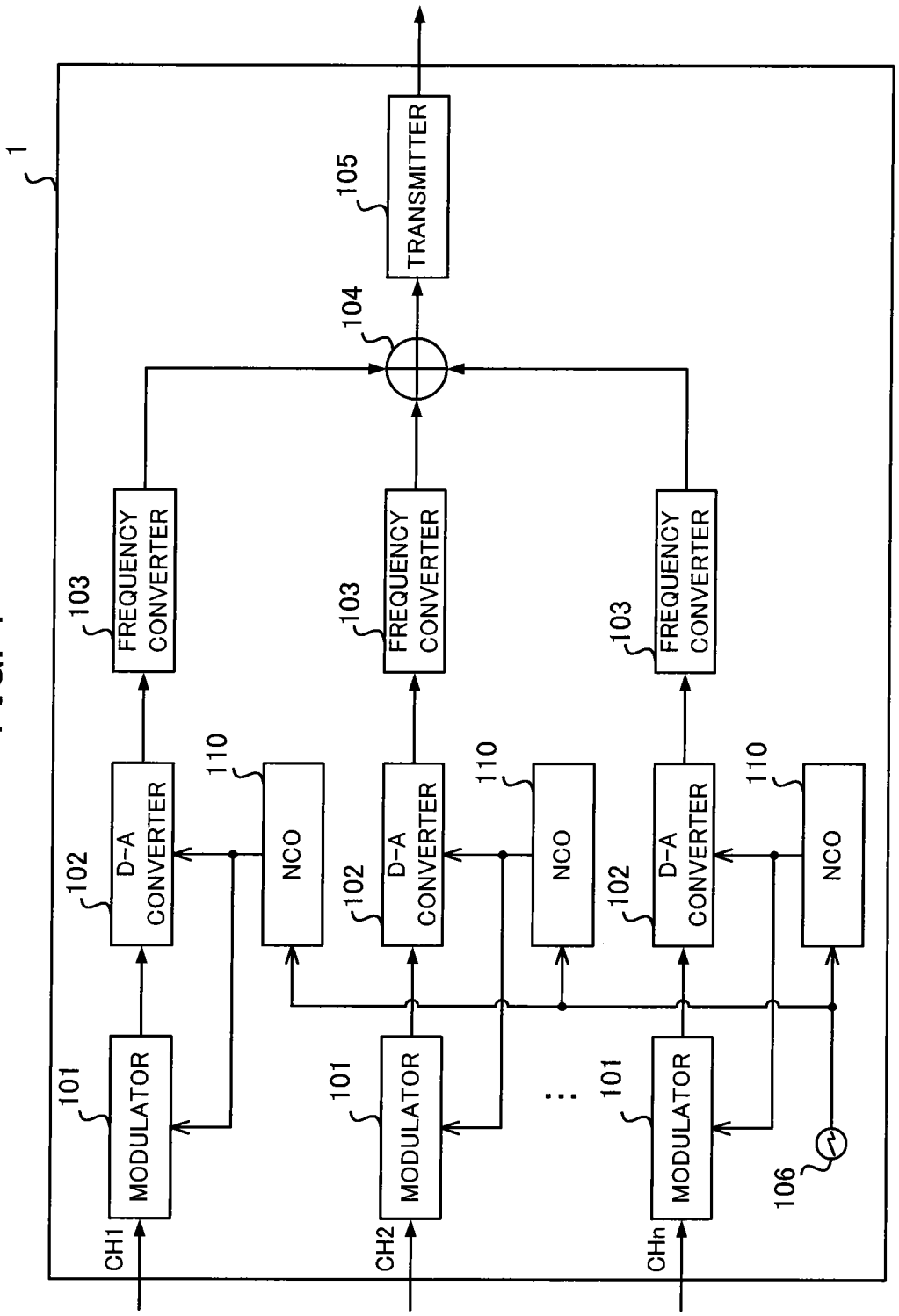
FIG. 1 is a block diagram illustrating a configuration example of a communication apparatus according to a first embodiment of the present disclosure.

FIG. 1 is a block diagram illustrating a configuration example of a communication apparatus according to a first embodiment of the present disclosure. A communication apparatus 1 for performing transmission processing according to the first embodiment includes, for each frequency channel, a modulator 101, a digital-to-analog (D-A) converter 102, a frequency converter 103, and a numerical controlled oscillator (NCO) 110. The communication apparatus 1 also includes an adder 104, a transmitter 105, and a master clock 106. The number of frequency channels is given as n in this embodiment. The communication apparatus 1 receives an input signal corresponding to each of the frequency channels CH1, CH2, ..., CHn.

Each input signal is modulated by the modulator 101, digital-to-analog converted by the D-A converter 102, and frequency-converted by the frequency converter 103 in accordance with a transmission frequency of each frequency channel. The frequency-converted input signals are combined by the adder 104 to be output as a modulated wave. The transmitter 105 transmits the modulated wave to another communication apparatus.

The modulator 101 and the D-A converter 102 each can use a signal obtained by multiplying or dividing the frequency of a reference signal. For example, the modulator 101 performs modulation based on a symbol clock having a frequency that is obtained by dividing the frequency of the reference signal, and the D-A converter 102 performs digital-to-analog conversion using a sampling clock having a frequency that is obtained by multiplying the frequency of the reference signal. The frequency of the symbol clock and the transmission frequency are different for each frequency channel. The NCO 110 generates a symbol clock based on a signal from the master clock 106.

Figure 2:
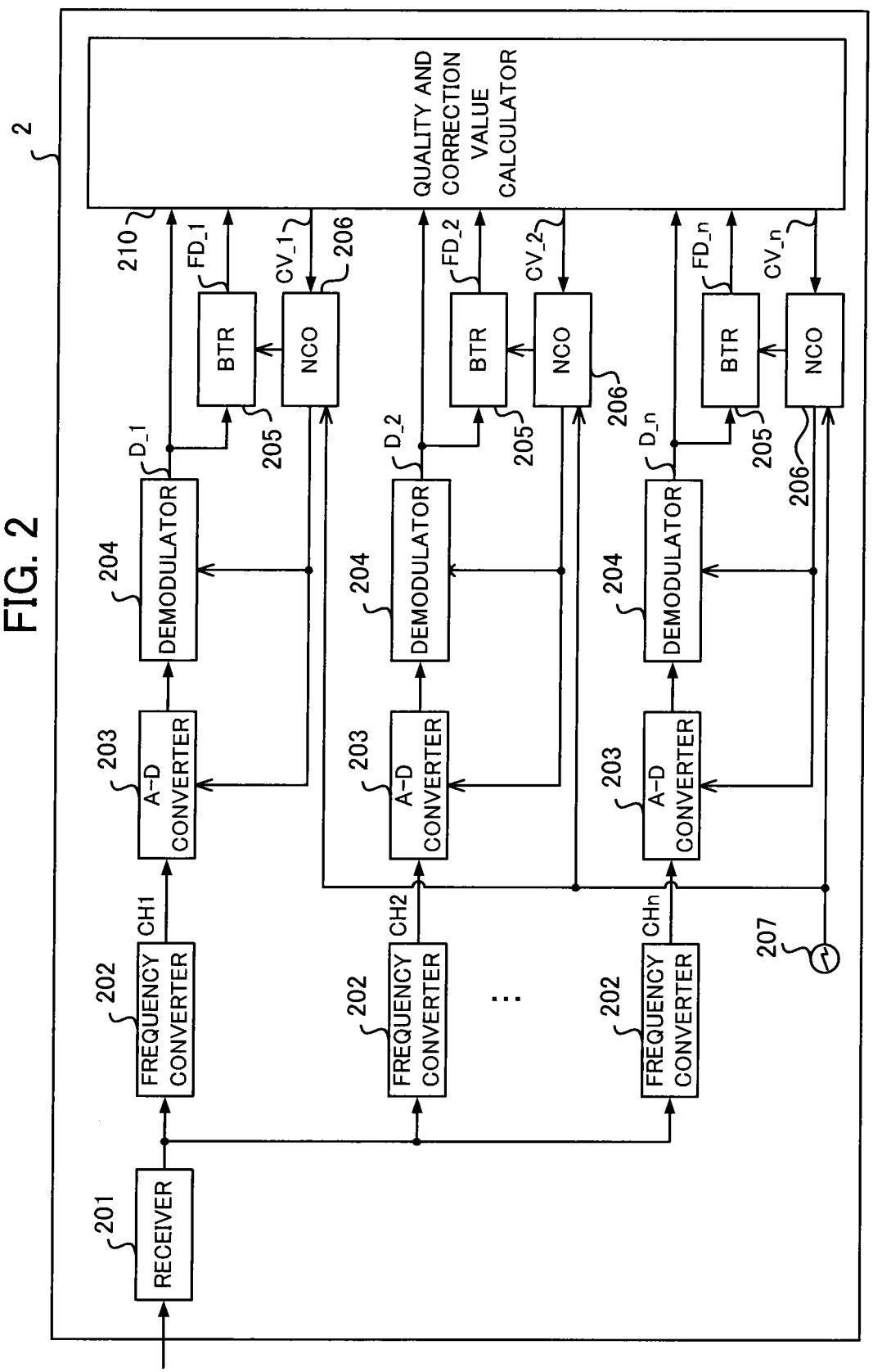
FIG. 2 is a block diagram illustrating a configuration example of a communication apparatus according to the first embodiment.

FIG. 2 is a block diagram illustrating a configuration example of a communication apparatus according to the first embodiment. A communication apparatus 2 for performing reception processing includes a receiver 201, a master clock 207, and a quality and correction value calculator 210. The communication apparatus 2 also includes, for each frequency channel, a frequency converter 202, an analog-to-digital (A-D) converter 203, a demodulator 204, a bit timing recovery (BTR) 205, and an NCO 206.

The receiver 201 receives the modulated wave with noise added thereto in a transmission path and sends the received signal to each frequency converter 202. The received signal is frequency-converted by the frequency converter 202 into a baseband signal in accordance with the reception frequency of each frequency channel, analog-to-digital converted by the A-D converter 203, and demodulated by the demodulator 204. The demodulator 204 sends the demodulated signal to the quality and correction value calculator 210 and the BTR 205. The A-D converter 203 and the demodulator 204 each can use a signal obtained by multiplying or dividing the frequency of a reference signal. For example, the A-D converter 203 performs analog-to-digital conversion using a sampling clock having a frequency that is obtained by multiplying the frequency of the reference signal, and the demodulator 204 performs demodulation based on the symbol clock having a frequency that is obtained by dividing the frequency of the reference signal.

The BTR 205 calculates a symbol clock frequency deviation that is a difference between a frequency (symbol rate) of the demodulated signal and a frequency of a symbol clock output by the corresponding NCO 206, and sends the symbol clock frequency deviation to the quality and correction value calculator 210. The NCO 206 operates as an oscillator for outputting a reference signal having a frequency corresponding to each of the channels, and generates a symbol clock based on a signal from the master clock 207. The BTR 205 operates, in each of the channels, as a deviation calculator for calculating a frequency deviation that is a difference in frequency between the demodulated signal and the symbol clock that is the reference signal.

Figure 3:
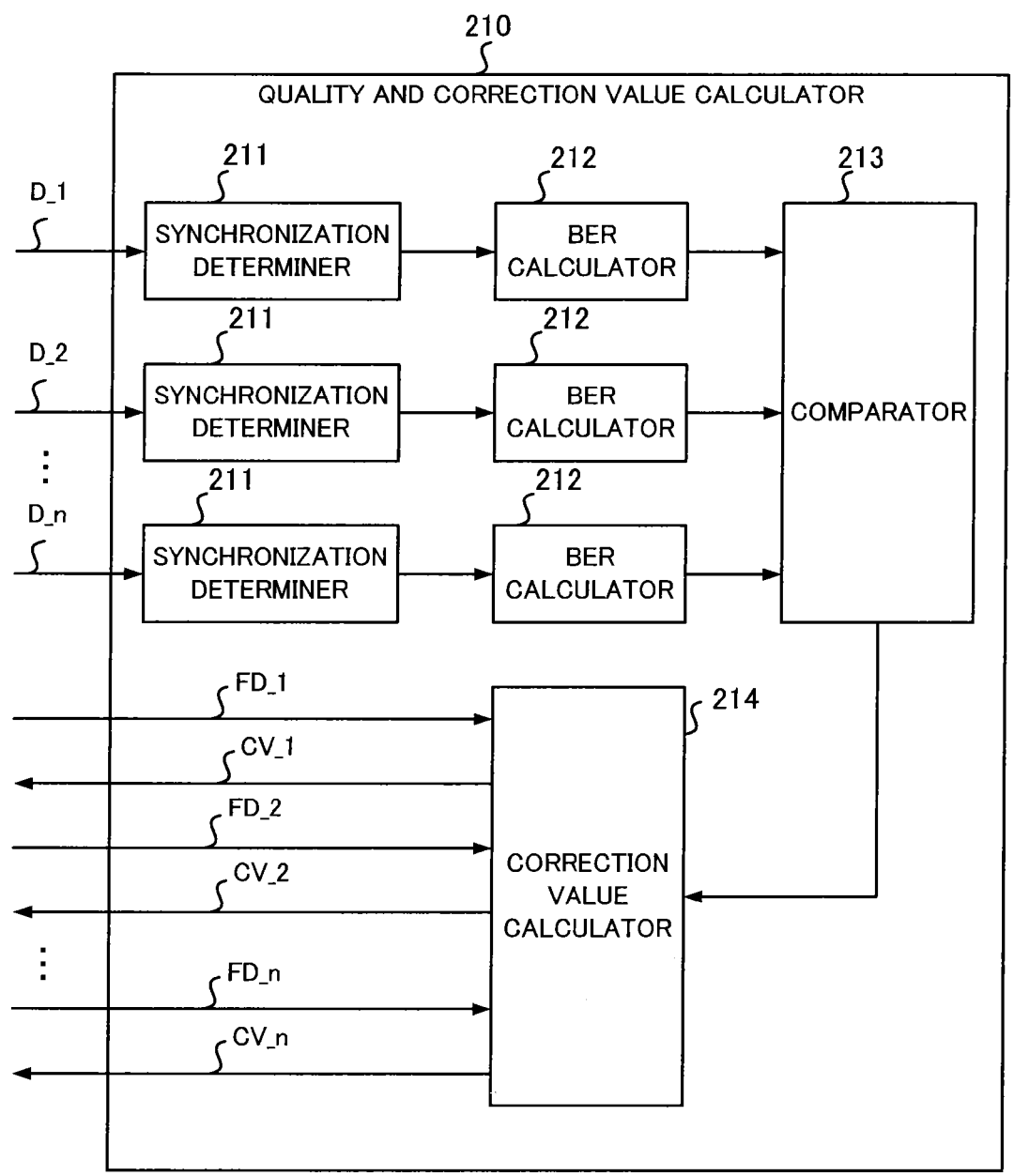
FIG. 3 is a block diagram illustrating a configuration example of a quality and correction value calculator according to the first embodiment.

FIG. 3 is a block diagram illustrating a configuration example of a quality and correction value calculator according to the first embodiment. The quality and correction value calculator 210 receives demodulated signals D_1, D_2, ..., D_n and symbol clock frequency deviations FD_1, FD_2, ..., FD_n in each of the frequency channels CH1, CH2, ..., CHn. The quality and correction value calculator 210 includes, correspondingly to each frequency channel, a synchronization determiner 211 and a bit error rate (BER) calculator 212. The quality and correction value calculator 210 also includes a comparator 213 and a correction value calculator 214.

The synchronization determiner 211 determines whether synchronization of the demodulated signal is established, and when the synchronization is established, sends the demodulated signal to the BER calculator 212. The BER calculator 212 calculates a pseudo BER of the demodulated signal with the synchronization established, and sends the pseudo BER to the comparator 213. The comparator 213 sends, to the correction value calculator 214, information about an evaluation scale defined for transmission quality. For example, the comparator 213 detects a frequency channel having the lowest pseudo BER in a most recent determined period, that is, the best value of the evaluation scale defined for the transmission quality in the most recent determined period, and sends the information about the frequency channel to the correction value calculator 214. The synchronization determiner 211, the BER calculator 212, and the comparator 213 cooperate to operate as a quality calculator for calculating the transmission quality of each of the frequency channels.

The correction value calculator 214 calculates a correction value for a symbol clock frequency in each frequency channel, based on the symbol clock frequency deviation in the frequency channel determined according to the transmission quality. For example, the correction value calculator 214 calculates a correction value CV_1, CV_2, ..., CV_n for the symbol clock frequency in each frequency channel, based on the symbol clock frequency deviation in the frequency channel having the best value of the evaluation scale defined for the transmission quality, and sends the correction value to the NCO 206 corresponding to each frequency channel. The NCO 206 corrects, based on the correction value, the frequency of the symbol clock, and outputs the symbol clock having the corrected frequency. The process of correcting the symbol clock frequency deviation is described in more detail hereinafter.

A symbol clock frequency $Fst_i$ at the transmitting side of a frequency channel CHi is represented by the following equation (1), where n is the number of the frequency channels and i is a natural number ranging from 1 to n. The same applies to the following description. In the following equation (1), Fct is a clock frequency of the master clock 106, p is the number of bits of resolution of the NCO 110, and $Kt_i$ is a step value in the NCO 110, for determining the symbol clock frequency $Fst_i$ at the transmitting side of the frequency channel CHi.

[Equation 1]

$$Fst_i = Fct \cdot \frac{Kt_i}{2^p} \qquad (1)$$

Figure 4:
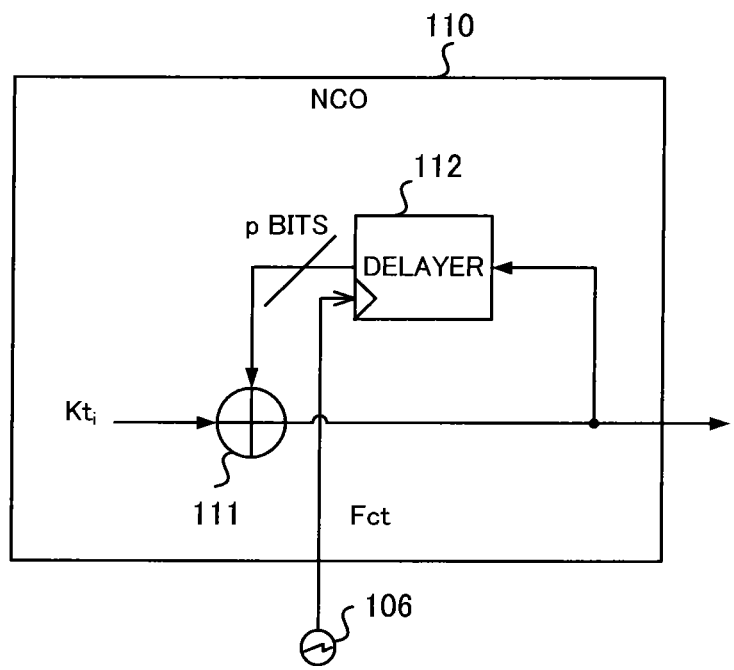
FIG. 4 is a block diagram illustrating a configuration example of an NCO according to the first embodiment.
Figure 5:
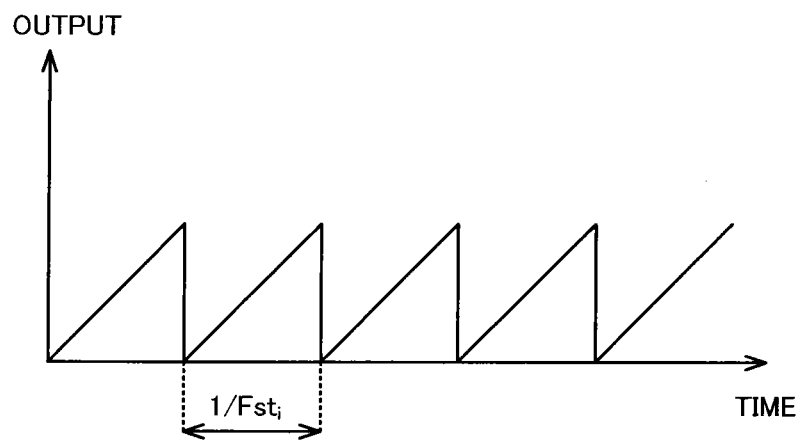
FIG. 5 is a diagram illustrating an example of output of the NCO according to the first embodiment.

FIG. 4 is a block diagram illustrating a configuration example of the NCO according to the first embodiment. The NCO 110 includes an adder 111 and a delayer 112. The step value $Kt_i$ is accumulated in response to the clock timing of the master clock 106, and the accumulation is reset when reaching p bits. FIG. 5 is a diagram illustrating an example of output of the NCO according to the first embodiment. The repetition frequency of the output value of the NCO 110 is the symbol clock frequency $Fst_i$ at the transmitting side.

Similarly, a symbol clock frequency $Fsr_i$ at the receiving side of the frequency channel CHi is represented by the following equation (2). In the equation (2), Fcr is a clock frequency of the master clock 207, p is the number of bits of resolution of the NCO 206, and $Kr_i$ is a step value in the NCO 206, for determining the symbol clock frequency at the receiving side of the frequency channel CHi. The configuration of the NCO 206 is similar to that of the NCO 110 as illustrated in FIG. 4.

[Equation 2]

$$Fsr_i = Fcr \cdot \frac{Kr_i}{2^p} \quad (2)$$

A symbol clock frequency deviation $\Delta Fs_i$ calculated by the BTR 205 corresponding to the frequency channel CHi is represented by the following equation (3). Since the step values for determining the symbol clock frequency are the same at the receiving and transmitting sides in the same frequency channel, it is assumed that $Kr_i = Kt_i = K_i$.

[Equation 3]

$$\begin{aligned}\Delta Fs_i &= Fsr_i - Fst_i \quad (3) \\ &= Fcr \cdot \frac{Kr_i}{2^p} - Fct \cdot \frac{Kt_i}{2^p} \\ &= (Fcr - Fct) \cdot \frac{K_i}{2^p}\end{aligned}$$

The symbol clock frequency deviation $\Delta Fs_i$ in the frequency channel CHi is determined by the clock frequency Fct of the master clock 106 at the transmitting side, the clock frequency Fcr of the master clock 207 at the receiving side, and a step value $K_i$ for determining the symbol clock frequency. The symbol clock frequency deviation $\Delta Fs_i$ varies for each frequency channel.

As an example, a situation in which the frequency channel CHn is a channel having the best value of the evaluation scale defined for the transmission quality is described hereinafter. As described above, the comparator 213 notifies the correction value calculator 214 that the frequency channel having the lowest pseudo BER is the frequency channel CHn. The symbol clock frequency deviation $\Delta Fs_n$ calculated by the BTR 205 corresponding to the frequency channel CHn is represented by the following equation (4).

[Equation 4]

$$\Delta Fs_n = (Fcr - Fct) \cdot \frac{K_n}{2^p} \quad (4)$$

A symbol clock frequency deviation $\Delta Fs_m$ of a frequency channel CHm is represented by the following equation (5) using the symbol clock frequency deviation of the frequency channel CHn and the step value for determining the symbol clock frequency. Specifically, the symbol clock frequency deviation of each frequency channel is calculated based on the symbol clock frequency deviation in the frequency channel having the best value of the evaluation scale defined for the transmission quality and the step value for determining the symbol clock frequency.

[Equation 5]

$$\begin{aligned}\Delta Fs_m &= (Fcr - Fct) \cdot \frac{K_m}{2^p} \quad (5) \\ &= \Delta Fs_n \cdot \frac{K_m}{K_n}\end{aligned}$$

The correction value calculator 214 calculates the symbol clock frequency deviation of each frequency channel, based on the symbol clock frequency deviation in the frequency channel having the best value of the evaluation scale defined for the transmission quality and the step value for determining the symbol clock frequency, and sends the symbol clock frequency deviation as a correction value to each NCO 206. In the frequency channel having the best value of the evaluation scale defined for the transmission quality, the correction value matches the output of the BTR 205.

The symbol clock frequency deviation of each frequency channel can be calculated, independently of the transmission quality in each frequency channel, based on the symbol clock frequency deviation in the frequency channel having the best value of the evaluation scale defined for the transmission quality. This can, for example, improve initial pull-in accuracy and reduce the time required for establishing reception synchronization.

Figure 6:
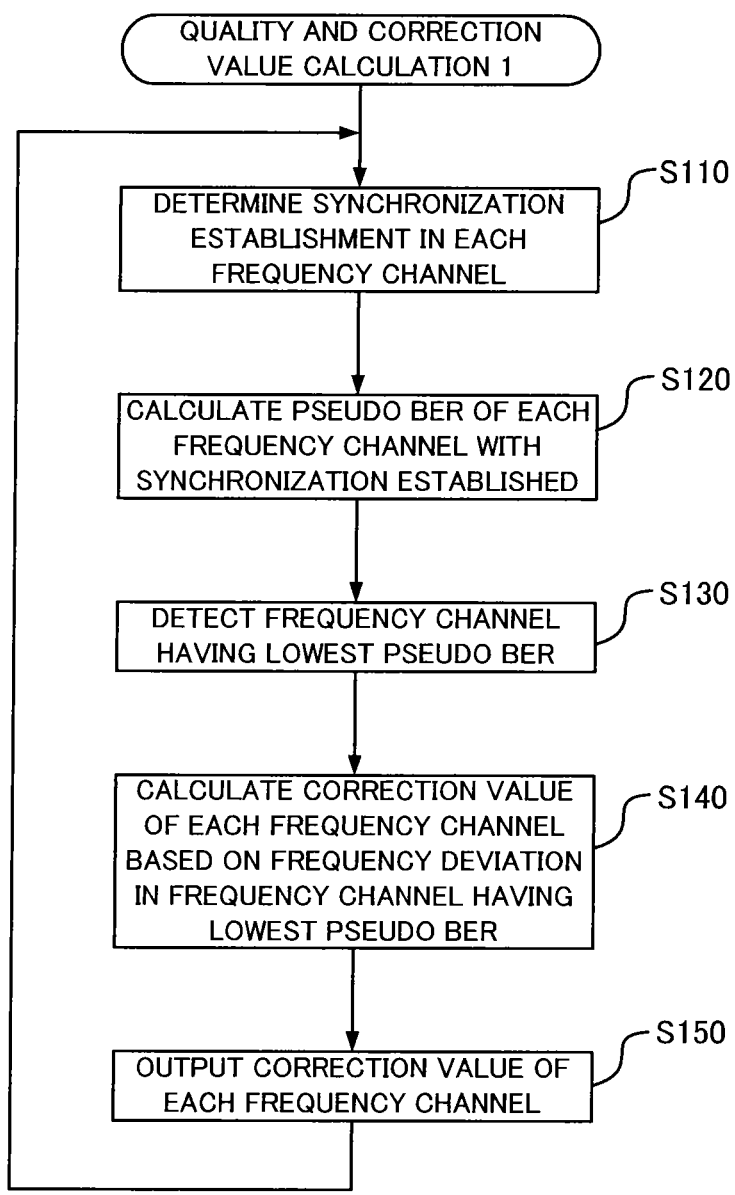
FIG. 6 is a flowchart illustrating an example of an operation of quality and correction value calculation performed by the communication apparatus according to the first embodiment.

FIG. 6 is a flowchart illustrating an example of an operation of the quality and correction value calculation performed by the communication apparatus according to the first embodiment. The synchronization determiner 211 determines whether synchronization of a demodulated signal is established (step S110). The BER calculator 212 calculates a pseudo BER of the demodulated signal with the synchronization established (step S120). The comparator 213 detects a frequency channel having the lowest pseudo BER (step S130). The correction value calculator 214 calculates a correction value CV_1, CV_2, . . . , CV_n for the symbol clock frequency in each frequency channel, based on the symbol clock frequency deviation in the frequency channel having the lowest pseudo BER (step S140). The correction value calculator 214 outputs the correction value CV_1, CV_2, . . . , CV_n (step S150). The communication apparatus 2 repeats this process at a determined interval.

As described above, the communication apparatus 2 according to the first embodiment calculates, based on the frequency deviation and the correction value that have been calculated, a correction value to be used for another frequency channel, and can reduce the time required for establishing reception synchronization.

Second Embodiment

Figure 7:
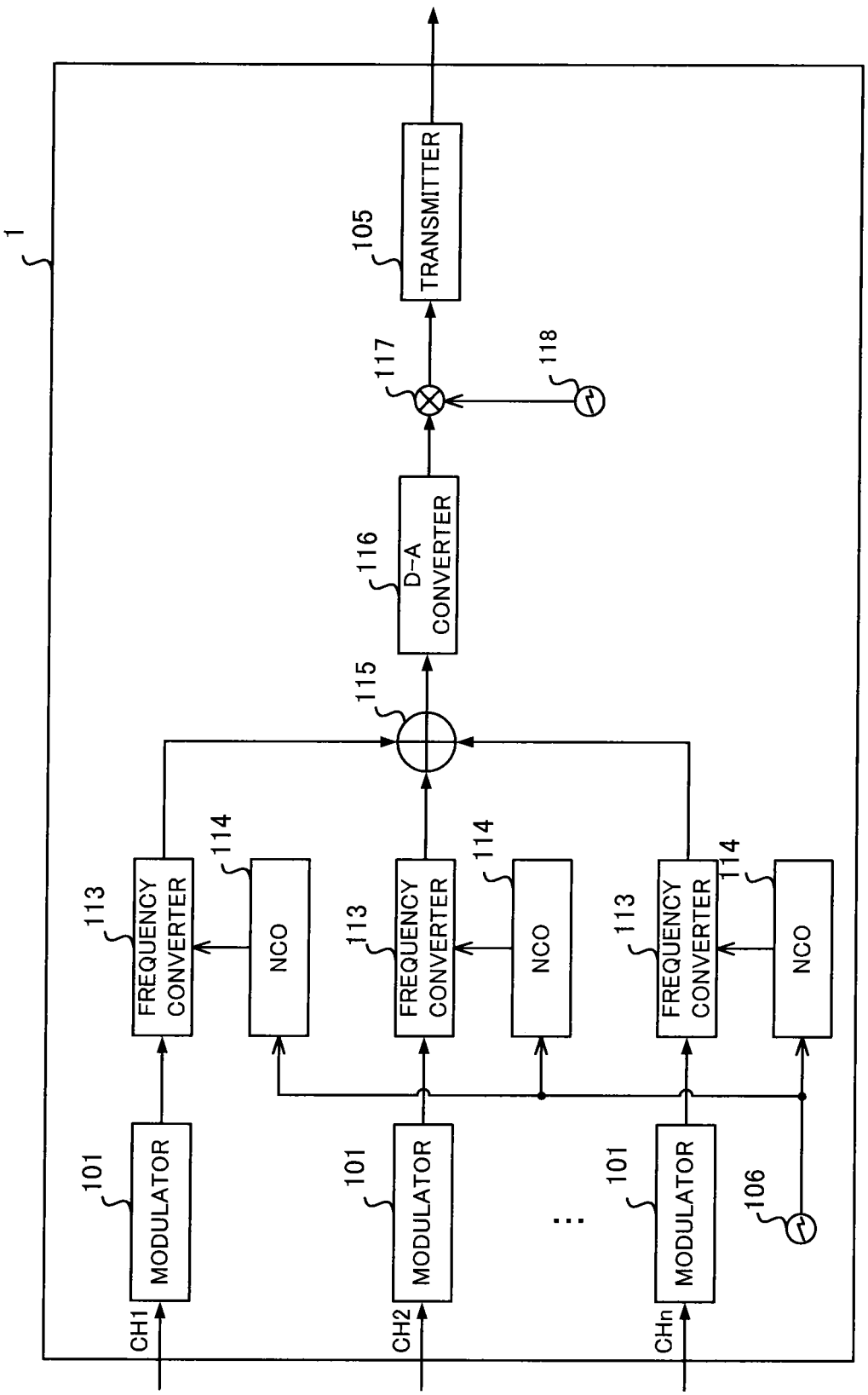
FIG. 7 is a block diagram illustrating a configuration example of a communication apparatus according to a second embodiment of the present disclosure.

FIG. 7 is a block diagram illustrating a configuration example of a communication apparatus according to a second embodiment of the present disclosure. A communication apparatus 1 for performing transmission processing according to the second embodiment includes, for each frequency channel, a modulator 101, a frequency converter 113, and an NCO 114. The communication apparatus 1 also includes an adder 115, a D-A converter 116, a multiplier 117, master clocks 106 and 118, and a transmitter 105. The communication apparatus 1 receives an input signal corresponding to each of the frequency channels CH1, CH2, ..., CHn.

Each input signal is modulated by the modulator 101 and sent to the frequency converter 113. Frequency allocation of each frequency channel is determined so that a difference between the frequency of each frequency channel and the transmission center frequency is different for each frequency channel. In the frequency converter 113, the input signal is frequency-converted into a set frequency that is set according to the frequency allocation of each frequency channel. The set frequency used in the frequency converter 113 is determined based on the frequency of an output signal of the NCO 114. The NCO 114 outputs a signal based on a signal from the master clock 106.

The frequency-converted input signals are combined by the adder 115 and digital-to-analog converted by the D-A converter 116 to be output as a modulated wave. The modulated wave is frequency-converted by the multiplier 117 into a transmission frequency band. The frequency conversion to the transmission frequency band is performed based on the clock frequency of the master clock 118. The transmitter 105 sends, to another communication apparatus, the modulated wave frequency-converted into the transmission frequency band.

Figure 8:
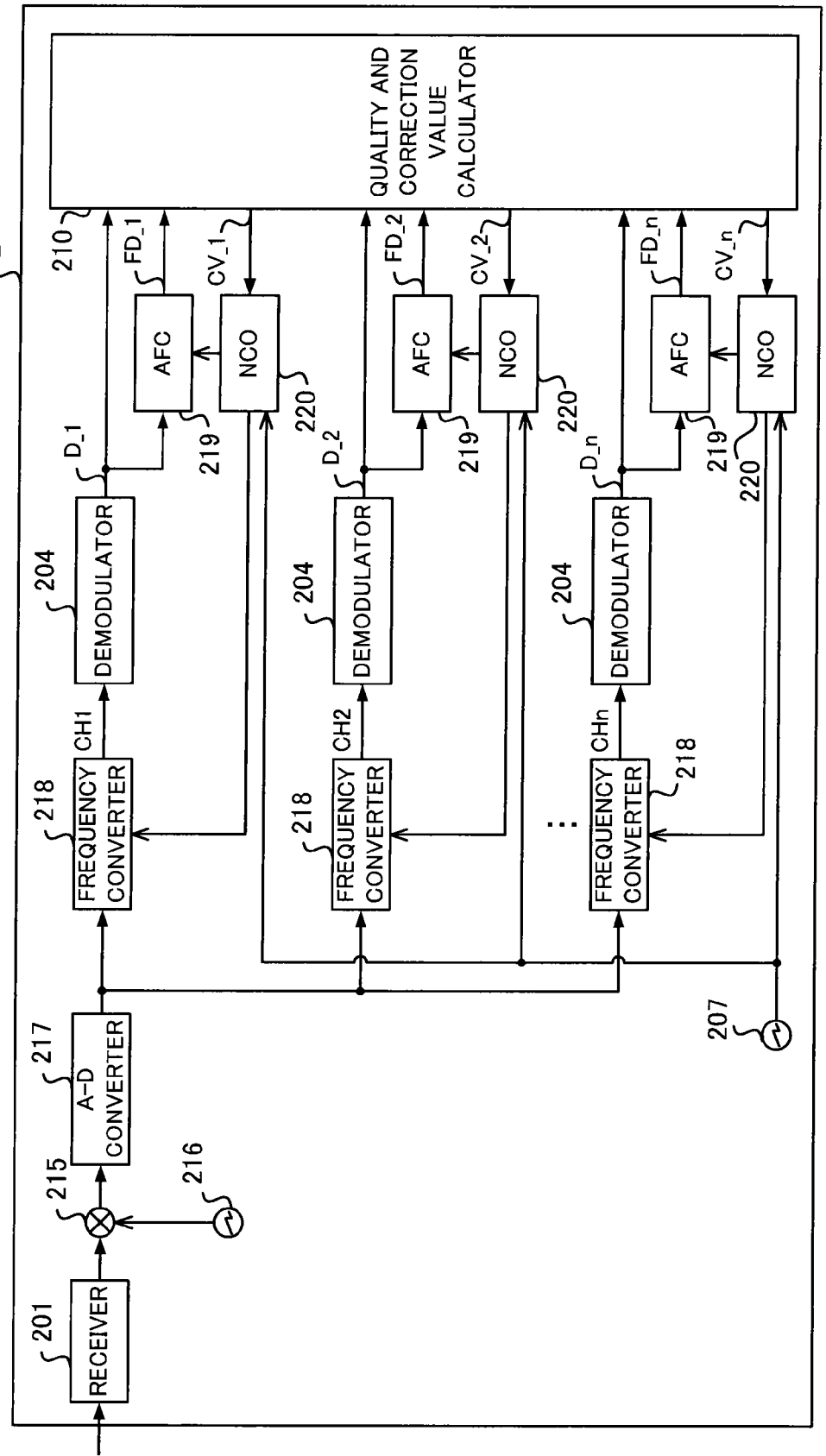
FIG. 8 is a block diagram illustrating a configuration example of a communication apparatus according to the second embodiment.

FIG. 8 is a block diagram illustrating a configuration example of a communication apparatus according to the second embodiment. A communication apparatus 2 for performing reception processing includes a receiver 201, a multiplier 215, master clocks 207 and 216, an A-D converter 217, and a quality and correction value calculator 210. The communication apparatus 2 also includes, for each frequency channel, a frequency converter 218, a demodulator 204, an automatic frequency control (AFC) 219, and an NCO 220.

The receiver 201 receives a signal frequency-converted by a satellite transponder and having noises added in the transmission path. The received signal is frequency-converted from the reception frequency band to a baseband signal band by the multiplier 215. The frequency conversion to the baseband signal band is performed based on the clock frequency of the master clock 216. The received signal frequency-converted to the baseband signal band is analog-to-digital converted by the A-D converter 217. The digitally-converted received signal is sent to each frequency converter 218, frequency-converted into a set frequency at the receiving side that is set according to the frequency allocation of each frequency channel, and sent to each demodulator 204 so as to be demodulated by the demodulator 204. The set frequency at the receiving side used in the frequency converter 218 is determined based on the frequency of an output signal of the NCO 220. The demodulator 204 sends the demodulated signal to the quality and correction value calculator 210 and the AFC 219.

The demodulated signal received by the AFC 219 includes the carrier frequency deviation accumulated by the master clock 118 at the transmitting side, the satellite transponder, and the master clock 216. The AFC 219 calculates a carrier frequency deviation that is a difference between the frequency of the demodulated signal (the carrier frequency for each frequency channel) and a frequency of the output signal of the corresponding NCO 220, and sends the carrier frequency deviation to the quality and correction value calculator 210. The NCO 220 operates as an oscillator for outputting a reference signal having a frequency corresponding to each of the frequency channels, and generates a signal based on a signal from the master clock 207. The AFC 219 operates, in each of the frequency channels, as a deviation calculator for calculating a frequency deviation that is a difference in frequency between the demodulated signal and the output signal of the NCO 220 that is the reference signal.

The configuration example of the quality and correction value calculator 210 according to the second embodiment is similar to that of the quality and correction value calculator 210 according to the first embodiment as illustrated in FIG. 3. Similarly to the first embodiment, the synchronization determiner 211 determines whether synchronization of a demodulated signal is established, and the BER calculator 212 calculates a pseudo BER of the demodulated signal with the synchronization established, and sends the pseudo BER to the comparator 213. The comparator 213 detects a frequency channel having the lowest pseudo BER, that is, the best value of the evaluation scale defined for the transmission quality and a frequency channel having the second lowest pseudo BER, that is, the second best value of the evaluation scale defined for the transmission quality, and sends the information about the detected frequency channels to the correction value calculator 214.

The correction value calculator 214 calculates a correction value CV_1, CV_2, ..., CV_n for the frequency of the output signal of the NCO 220 in each frequency channel, based on the carrier frequency deviation in a frequency channel having the best value of the evaluation scale defined for the transmission quality and based on a difference between the carrier frequency deviation in the frequency channel having the best value of the evaluation scale defined for the transmission quality and the carrier frequency deviation in a frequency having the second best value of the evaluation scale defined for the transmission quality, and sends the correction value to the NCO 220 corresponding to each frequency channel. The NCO 220 corrects, based on the correction value, the frequency of the signal and outputs the signal having the corrected frequency. A process for correcting the carrier frequency deviation is described in more detail hereinafter.

A set frequency $Fft_i$ at the transmitting side of a frequency channel CHi is represented by the following equation (6). In the following equation (6), Fct is a clock frequency of the master clock 106, q is the number of bits of resolution of the NCO 114, and $Jt_i$ is a step value in the NCO 114, for determining the set frequency $Fft_i$ at the transmitting side of the frequency channel CHi.

[Equation 6]

$$Fft_i = Fct \cdot \frac{Jt_i}{2^q} \quad (6)$$

Similarly, a set frequency $Ffr_i$ at the receiving side of the frequency channel CHi is represented by the following equation (7). In the equation (7), Fcr is a clock frequency of the master clock 207, q is the number of bits of resolution of the NCO 220, and $Jr_i$ is a step value in the NCO 220, for determining the set frequency $Ffr_i$ at the receiving side of the frequency channel CHi.

[Equation 7]

$$Ffr_i = Fcr \cdot \frac{Jr_i}{2^q} \quad (7)$$

A carrier frequency deviation $\Delta Ff_i$ calculated by the AFC 219 corresponding to the frequency channel CHi is represented by the following equation (8). Fd is a carrier frequency deviation accumulated by the master clock 118, the satellite transponder, and the master clock 216. Since the step values for determining the set frequency are the same at the transmitting and receiving sides in the same frequency channel, it is assumed that $Jr_i = Jt_i = J_i$.

[Equation 8]

$$\Delta Ff_i = Ffr_i - Fft_i + Fd \qquad (8)$$
$$= Fcr \cdot \frac{Jr_i}{2^q} - Fct \cdot \frac{Jt_i}{2^q} + Fd$$
$$= (Fcr - Fct) \cdot \frac{J_i}{2^q} + Fd$$

The carrier frequency deviation $\Delta Ff_i$ in the frequency channel CHi is determined by a clock frequency Fct of the master clock 106 at the transmitting side, the clock frequency Fcr of the master clock 207 at the receiving side, and a step value $J_i$ for determining the carrier frequency. The carrier frequency deviation $\Delta Ff_i$ varies for each frequency channel. Fd is the same value for all the frequency channels.

As an example, a situation in which the frequency channel CH1 is a channel having the best value of the evaluation scale defined for the transmission quality and the frequency channel CH2 is a channel having the second best value of the evaluation scale defined for the transmission quality is described hereinafter. The carrier frequency deviations $\Delta Ff_1$ and $\Delta Ff_2$ calculated by the AFCs 219 corresponding to the frequency channels CH1 and CH2 are represented by the following equation (9).

[Equation 9]

$$\Delta Ff_1 = (Fcr - Fct) \cdot \frac{J_1}{2^q} + Fd \qquad (9)$$
$$\Delta Ff_2 = (Fcr - Fct) \cdot \frac{J_2}{2^q} + Fd$$

A difference $\Delta Ff_{2\_1}$ between the carrier frequency deviations $\Delta Ff_1$ and $\Delta Ff_2$ is represented by the following equation (10). The difference between the step values $J_2$ and $J_1$ is designated as $\Delta J_{2\_1}$.

[Equation 10]

$$\Delta Ff_{2\_1} = \Delta Ff_2 - \Delta Ff_1 \qquad (10)$$
$$= (Fcr - Fct) \cdot \frac{J_2}{2^q} - (Fcr - Fct) \cdot \frac{J_1}{2^q}$$
$$= (Fcr - Fct) \cdot \frac{1}{2^q} \cdot (J_2 - J_1)$$
$$= (Fcr - Fct) \cdot \frac{1}{2^q} \cdot \Delta J_{2\_1}$$

A difference $\Delta Ff_{n\_1}$ between the carrier frequency deviation of the frequency channel CHn and the carrier frequency deviation of the frequency channel CH1 is represented by the following equation (11). The difference between the step values $J_n$ and $J_1$ is designated as $\Delta J_{n\_1}$.

[Equation 11]

$$\Delta Ff_{n\_1} = (Fcr - Fct) \cdot \frac{1}{2^q} \cdot (J_n - J_1) \qquad (11)$$
$$= (Fcr - Fct) \cdot \frac{1}{2^q} \cdot \Delta J_{n\_1}$$
$$= \Delta Ff_{2\_1} \cdot \frac{\Delta J_{n\_1}}{\Delta J_{2\_1}}$$

The carrier frequency deviation $\Delta Ff_n$ of the frequency channel CHn is represented by the following equation (12), using the carrier frequency deviation in the frequency channel CH1, the difference between the carrier frequency deviations of the frequency channels CH1 and CH2, and the step value for determining the carrier frequency. Specifically, the carrier frequency deviation of each frequency channel is calculated by the carrier frequency deviation in the frequency channel having the best value of the evaluation scale defined for the transmission quality, the difference between the carrier frequency deviation in the frequency channel having the best value of the evaluation scale defined for the transmission quality and the carrier frequency deviation in the frequency channel having the second best value of the evaluation scale defined for the transmission quality, and the step value for determining the carrier frequency.

[Equation 12]

$$\Delta Ff_n = \Delta Ff_1 + \Delta Ff_{n\_1} \qquad (12)$$
$$= \Delta Ff_1 + \Delta Ff_{2\_1} \cdot \frac{\Delta J_{n\_1}}{\Delta J_{2\_1}}$$

The correction value calculator 214 calculates the carrier frequency deviation of each frequency channel, based on the carrier frequency deviation in the frequency channel having the best value of the evaluation scale defined for the transmission quality, the difference between the carrier frequency deviation in the frequency channel having the best value of the evaluation scale defined for the transmission quality and the carrier frequency deviation in the frequency channel having the second best value of the evaluation scale defined for the transmission quality, and the step value for determining the carrier frequency, and sends the carrier frequency deviation as a correction value to each NCO 220. In the frequency channel having the best value of the evaluation scale defined for the transmission quality, the correction value matches the output of the AFC 219.

The carrier frequency deviation of each frequency channel can be calculated, independently of the transmission quality in each frequency channel, based on the carrier frequency deviation in the frequency channel having the best value of the evaluation scale defined for the transmission quality and the carrier frequency deviation in the frequency channel having the second best value of the evaluation scale defined for the transmission quality. This can, for example, improve initial pull-in accuracy and reduce the time required for establishing reception synchronization.

Figure 9:
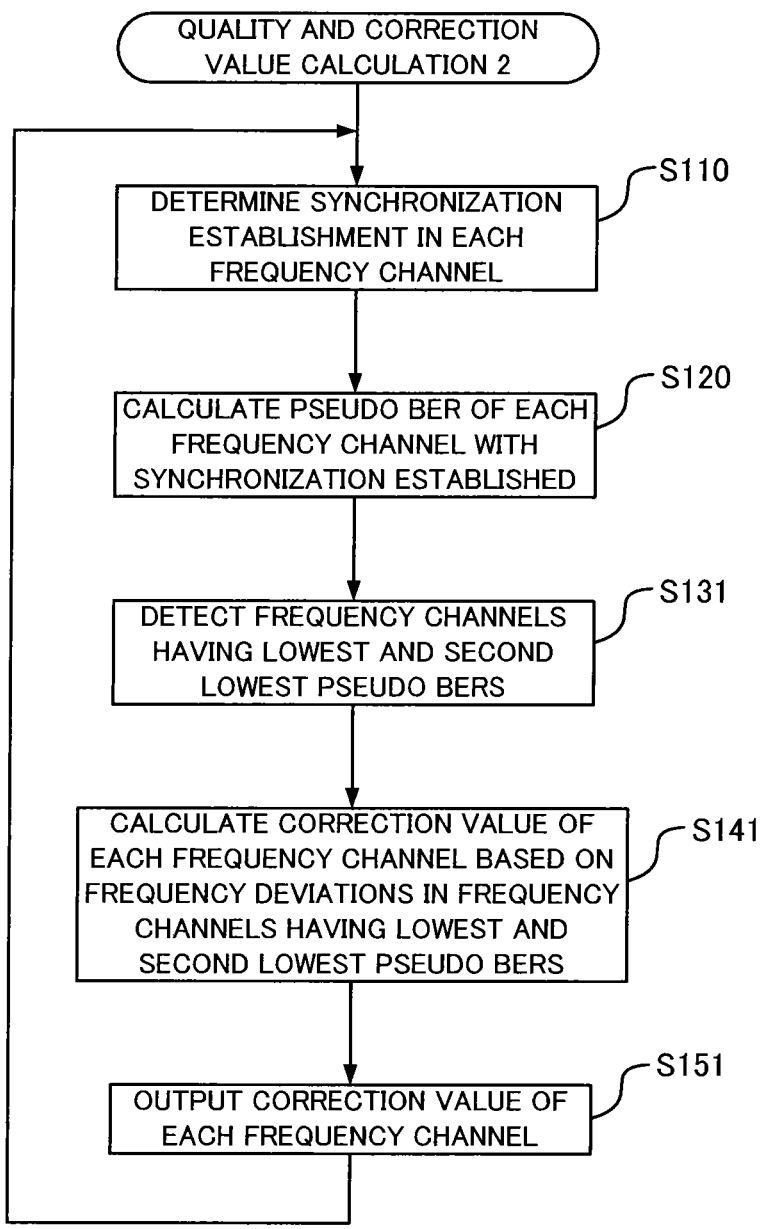
FIG. 9 is a flowchart illustrating an example of an operation of quality and correction value calculation performed by the communication apparatus according to the second embodiment.

FIG. 9 is a flowchart illustrating an example of an operation of quality and correction value calculation performed by the communication apparatus according to the second embodiment. The processing in steps S110 and S120 is similar to the processing performed by the communication apparatus 2 according to the first embodiment as illustrated in FIG. 6. The comparator 213 detects a frequency channel having the lowest pseudo BER and a frequency channel having the second lowest pseudo BER (step S131). The correction value calculator 214 calculates a correction value $CV\_1, CV\_2, \ldots, CV\_n$ for the frequency of the output signal of the NCO 220 in each frequency channel, based on the carrier frequency deviation in the frequency channel having the lowest pseudo BER and the carrier frequency deviation in the frequency channel having the second lowest pseudo BER (step S141). The correction value calculator 214 outputs the correction value $CV\_1, CV\_2, \ldots, CV\_n$ (step S151). The communication apparatus 2 repeats this process at a determined interval.

As described above, the communication apparatus 2 according to the second embodiment calculates, based on the frequency deviation and the correction value that have been calculated, a correction value to be used for another frequency channel, and can reduce the time required for establishing reception synchronization.

Embodiments of the present disclosure are not limited to the above described embodiments. The evaluation scale defined for the transmission quality is not limited to the pseudo BER, and measured jitter or slips, for example, can be used as an evaluation scale.

The present disclosure can be embodied in various ways and can undergo various modifications without departing from the broad spirit and scope of the disclosure. Moreover, the embodiments described above are for explaining the present disclosure, and do not limit the scope of the present disclosure. In other words, the scope of the present disclosure is as set forth in the Claims and not the embodiments. Various changes and modifications that are within the scope disclosed in the claims or that are within a scope that is equivalent to the claims of the disclosure are also included within the scope of the present disclosure.

This application claims the benefit of Japanese Patent Application No. 2013-83441, filed on Apr. 12, 2013, the entire disclosure of which is incorporated by reference herein.

REFERENCE SIGNS LIST 1, 2 Communication apparatus
101 Modulator
102, 116 D-A converter
103, 113, 202, 218 Frequency converter
104, 111, 115 Adder
105 Transmitter
106, 118, 207, 216 Master clock
110, 114, 206, 220 Numerical controlled oscillator (NCO)
112 Delayer
117, 215 Multiplier
201 Receiver
203, 217 A-D converter
204 Demodulator
205 Bit timing recovery (BTR)
210 Quality and correction value calculator
211 Synchronization determiner
212 BER calculator
213 Comparator
214 Correction value calculator
219 Automatic frequency control (AFC)

The invention claimed is:

1. A communication apparatus for receiving signals of a plurality of frequency channels, comprising:
   an oscillator to output a reference signal having a frequency corresponding to each of the frequency channels;
   a demodulator to demodulate a signal received in each of the frequency channels and to generate a demodulated signal;
   a deviation calculator to calculate a frequency deviation that is a difference in frequency between the demodulated signal and the reference signal in each of the frequency channels;
   a quality calculator to calculate transmission quality of each of the frequency channels; and
   a correction value calculator to calculate, based on the frequency deviation in a frequency channel determined according to the transmission quality calculated by the quality calculator, a correction value for the frequency of the reference signal in each of the frequency channels,
   wherein the oscillator corrects, based on the correction value, the frequency of the reference signal, and outputs the reference signal having the corrected frequency.

2. The communication apparatus according to claim 1, wherein
   the reference signal is used for analog-to-digital conversion and demodulation, and
   the correction value calculator calculates, based on the frequency deviation in a frequency channel having best value of an evaluation scale defined for the transmission quality, a correction value for the frequency of the reference signal in each of the frequency channels.

3. The communication apparatus according to claim 1, wherein
   the reference signal is used for frequency conversion in each of the frequency channels, and
   the correction value calculator calculates a correction value for a frequency of the reference signal in each of the frequency channels, based on the frequency deviation in a frequency channel having best value of the evaluation scale defined for the transmission quality and based on a difference between the frequency deviation in the frequency channel having the best value of the evaluation scale and the frequency deviation in a frequency channel having second best value of the evaluation scale.

4. The communication apparatus according to claim 1, wherein the quality calculator determines, for each of the frequency channels, whether synchronization is established, and calculates a pseudo bit error rate in a most recent determined period for each of the frequency channels with the synchronization established, the pseudo bit error rate indicating the transmission quality.

5. The communication apparatus according to claim 2, wherein the quality calculator determines, for each of the frequency channels, whether synchronization is established, and calculates a pseudo bit error rate in a most recent determined period for each of the frequency channels with the synchronization established, the pseudo bit error rate indicating the transmission quality.

6. The communication apparatus according to claim 3, wherein the quality calculator determines, for each of the frequency channels, whether synchronization is established, and calculates a pseudo bit error rate in a most recent determined period for each of the frequency channels with the synchronization established, the pseudo bit error rate indicating the transmission quality.

7. A reception method performed by a communication apparatus for receiving signals of a plurality of frequency channels, the reception method comprising:

oscillating to output a reference signal having a frequency corresponding to each of the frequency channels;
demodulating a signal received in each of the frequency channels to generate a demodulated signal;
calculating a frequency deviation that is a difference in frequency between the demodulated signal and the reference signal in each of the frequency channels;
calculating transmission quality of each of the frequency channels;
calculating, based on the frequency deviation in a frequency channel determined for the transmission quality calculated in the calculating of the transmission quality, a correction value for the frequency of the reference signal in each of the frequency channels; and
correcting, based on the correction value, the frequency of the reference signal.

8. The reception method according to claim 7, wherein
the reference signal is used for analog-to-digital conversion and demodulation, and
the calculating of the correction value includes calculating, based on the frequency deviation in a frequency channel having best value of an evaluation scale defined for the transmission quality, a correction value for the frequency of the reference signal in each of the frequency channels.

9. The reception method according to claim 7, wherein
the reference signal is used for frequency conversion in each of the frequency channels, and
the calculating of the correction value includes calculating a correction value for a frequency of the reference signal in each of the frequency channels, based on the frequency deviation in a frequency channel having best value of an evaluation scale defined for the transmission quality and based on a difference between the frequency deviation in the frequency channel having the best value of the evaluation scale and the frequency deviation in a frequency channel having second best value of the evaluation scale.

10. The reception method according to claim 7, wherein the calculating of the transmission quality includes determining, for each of the frequency channels, whether synchronization is established, and calculating a pseudo bit error rate in a most recent determined period for each of the frequency channels with the synchronization established, the pseudo bit rate indicating the transmission quality.

11. The reception method according to claim 8, wherein the calculating of the transmission quality includes determining, for each of the frequency channels, whether synchronization is established, and calculating a pseudo bit error rate in a most recent determined period for each of the frequency channels with the synchronization established, the pseudo bit rate indicating the transmission quality.

12. The reception method according to claim 9, wherein the calculating of the transmission quality includes determining, for each of the frequency channels, whether synchronization is established, and calculating a pseudo bit error rate in a most recent determined period for each of the frequency channels with the synchronization established, the pseudo bit rate indicating the transmission quality.

* * * * *